United States Patent [19]

Masuko et al.

[11] Patent Number: 4,974,121
[45] Date of Patent: Nov. 27, 1990

[54] WIRING MODULE

[75] Inventors: Kazuhisa Masuko; Yosuke Ishiguro, both of Kanagawa, Japan

[73] Assignee: Fuji Xerox Co., Ltd., Tokyo, Japan

[21] Appl. No.: 199,878

[22] Filed: May 27, 1988

[30] Foreign Application Priority Data

May 29, 1987 [JP] Japan ................................ 62-131342
Jun. 5, 1987 [JP] Japan ................................ 62-139999

[51] Int. Cl.$^5$ ............................................. H02B 1/20
[52] U.S. Cl. ................................ 361/428; 174/35 R; 361/398; 361/413; 361/424; 361/383; 439/325; 439/544
[58] Field of Search ................... 174/35 R, 35 MS; 361/398, 413, 428, 424, 429, 383, 395; 439/298, 325, 327, 328, 378, 379, 449, 470, 544, 545, 549, 567

[56] References Cited

U.S. PATENT DOCUMENTS 3,836,415  9/1974  Hinderbrandt ....................... 156/296

FOREIGN PATENT DOCUMENTS 0090539 10/1983 European Pat. Off. ............ 361/424
0235924  9/1987 European Pat. Off. .
2851858  5/1979 Fed. Rep. of Germany ...... 361/398
 948055  1/1964 United Kingdom .
1021369  3/1966 United Kingdom .
1413518 11/1975 United Kingdom .

Primary Examiner—Gregory D. Thompson
Attorney, Agent, or Firm—Finnegan, Henderson, Farabow, Garett, and Dunner

[57] ABSTRACT

A wiring module for electrically connecting a plurality of electric parts disposed on an equipment frame to a source of electric power, the module comprising an elongated insulating substrate formed to extend along a path adjacent to electric parts disposed on the frame. A pattern of wiring conductors extends along and integral with the insulating substrate for conducting electric current from the source of electric power to each of the electric parts to be connected. The insulating substrate has one or more edge portions provided with protrusions integrally formed with the substrate and extending laterally therefrom. The protrusions each are positioned on the insulating substrate at a location adjacent an electric part to be connected and at least a portion of the wiring conductors are integral with the protrusions to provide a contact on the protrusions for connection to corresponding electric parts.

18 Claims, 14 Drawing Sheets

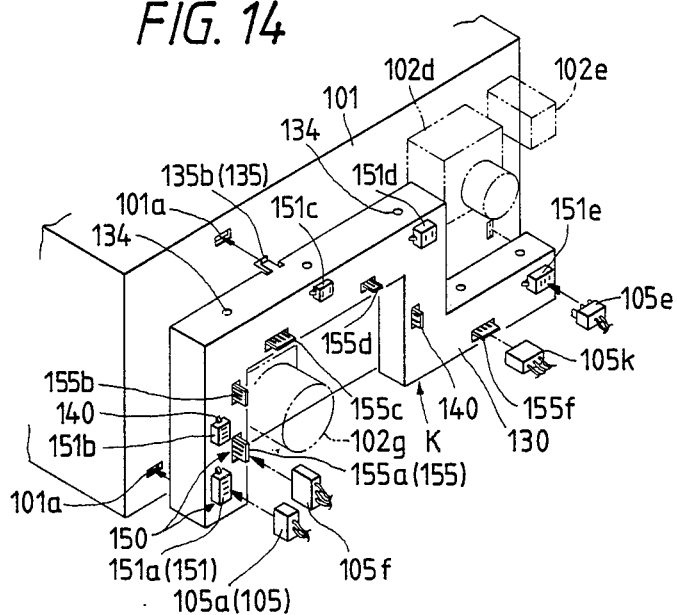
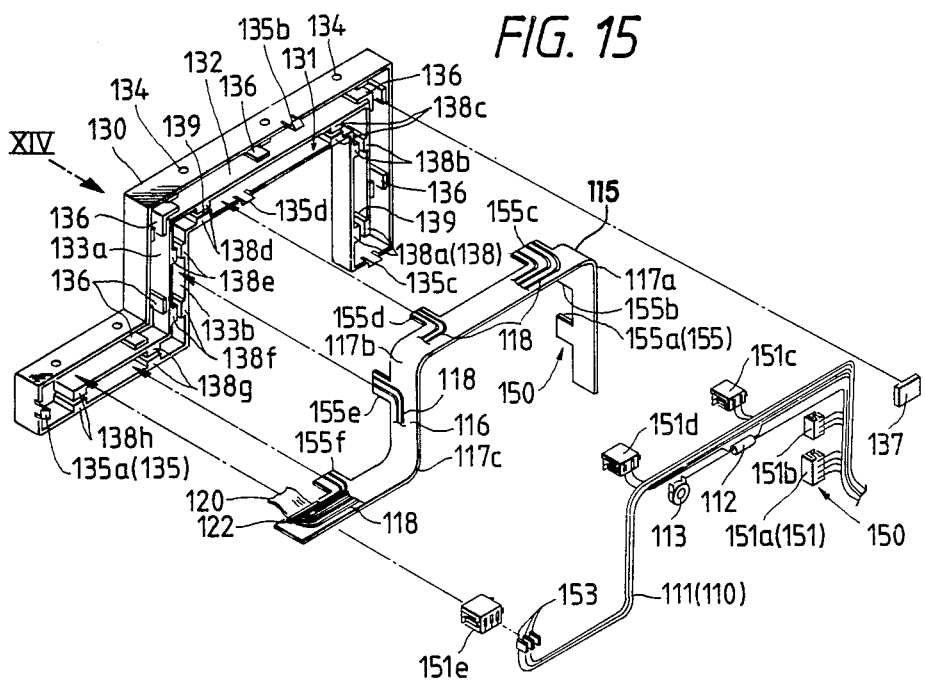

WIRING MODULE

BACKGROUND OF THE INVENTION

This invention relates to a wiring module for carrying current to electric parts, and is more particularly relates to an improvement of a wiring module employed when disposing a plurality of electric parts on an equipment frame.

In various electrical machinery and apparatuses including office automation equipment such as copying machine, printer and the like, a plurality of electric parts 2 (2a to 2c concretely) are disposed on an equipment frame 1, and a wiring harness 3 is used as wiring part capable of carrying current to each electric part 2 as shown in FIG. 1 is known well hitherto.

However, in such a conventional wiring part the wiring harness 3 is lengthy and indefinite in shape. Therefore, each wiring harness 3 is often entangled at the time of distributing the wiring harness on the equipment, thus causing a problem in handling on each occasion.

Further, the wiring harness must be moved to a position on a side of the electric parts 2 at the time of performing such work. If, however, the distributed wiring harness 3 shifts needlessly, it may interfere with the electric parts 2 and others. Thus, it is necessary to bundle and retain the wiring harness 3 at each position by means of a clamp member 4, which increases the number of parts, increases the cost and also causes problems in distributing the harness on the equipment.

Further, a connector 5 on a side of the electric parts 2 and a connector parts 6 on a side of the wiring harness 3 are required for connecting each electric part 2 and the wiring harness and at wiring harness 3. Since both connectors 5, 6 are normally left free, however, both must be connected with each other while they are held in both hands. Thus, the connectors 5, 6 involve a two-handed operation for connection, which is troublesome. Reference numeral 7 denotes a connector for connecting sections of the wiring harness 3 with each other.

SUMMARY OF THE INVENTION

The present invention has been made to overcome the aforementioned problems. An object of this invention is to provide a wiring module, which is cheaply manufactured and easily handled, while simplifying the distribution of the harness and connecting it to the electric parts disposed on an equipment frame.

The above object is achieved by the provision of a wiring module for electrically connecting a plurality of electric parts disposed on an equipment frame to a source of electric power, comprising an elongated insulating substrate for attachment to the equipment frame and formed to extend along a path adjacent to electric parts disposed on the frame; a pattern of wiring conductors extending along an integral with the insulating substrate for conducting electric current from a source of electric power to each of the electric parts to be connected; the insulating substrate having one or more edge portions provided with protrusions integrally formed with the insulating substrate and extending laterally therefrom, the protrusions each being positioned on the insulating substrate at a location adjacent an electric part to be connected and at least a portion of the wiring conductors being integral therewith, so as to provide a contact on the protrusions for connection to a corresponding one of the electric parts to be connected.

Further, the above object is also achieved by the provision of the wiring module comprising wiring parts for forming a current carrying path to each of the electric parts, a module case formed continuously along the position in the neighborhood of each electric part for enclosing and holding the wiring parts therein and mounted detachably to a corresponding mounting portion of the equipment frame, and a wiring connector disposed fixedly on the portion of the wiring parts corresponding to the position in the neighborhood of each electric part and connected to each electric part connector.

BRIEF DESCRIPTION OF THE DRAWINGS

FIG. 7 is a modification of the wiring connector shown in FIG. 5, representing a variant of wiring connector used in;

FIG. 14 is a perspective view of the wiring module as shown in FIG. 13;

FIG. 15 is an exploded perspective view of the wiring module of the fourth embodiment;

FIG. 19 (B) to (D) are perspective views for showing a variant thereof;

DETAILED DESCRIPTION OF THE INVENTION

The invention will now be described in detail with reference to the accompanying drawings representing preferred embodiments thereof.

Figure 2:
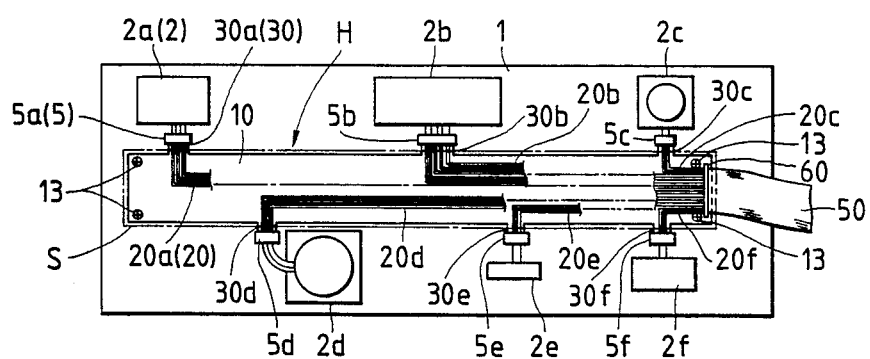
FIG. 2 is a schematic diagram representing a first embodiment of the wiring module according to the invention which is mounted on an equipment frame.
Figure 3:
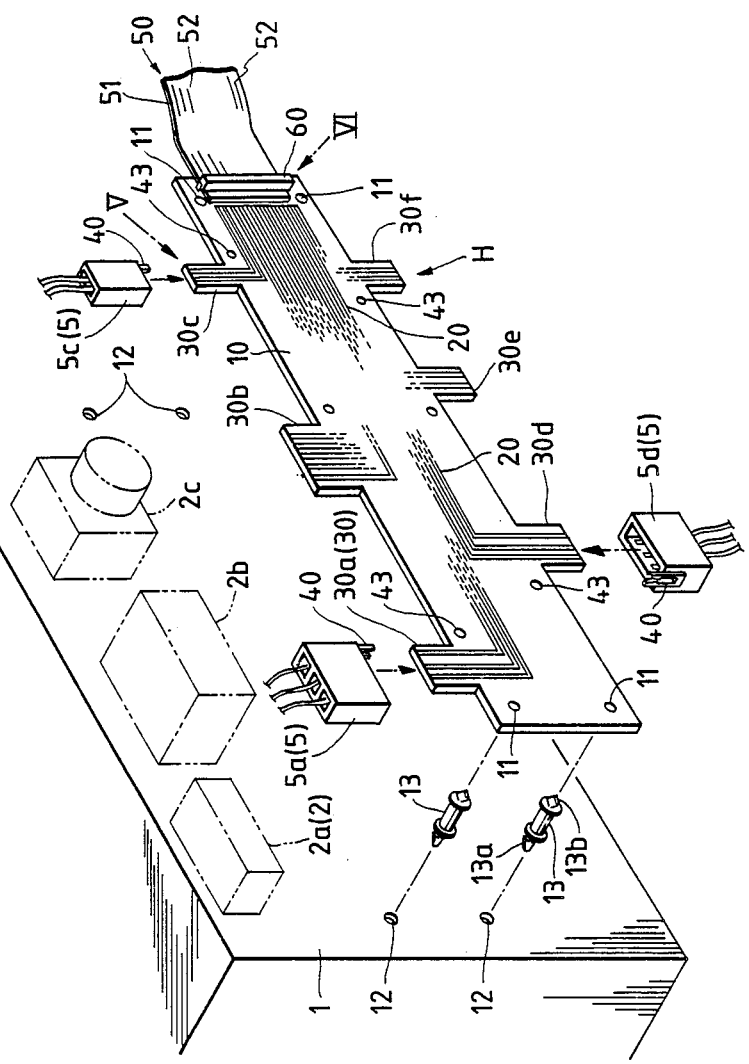
FIG. 3 is a perspective view of the wiring part as shown in FIG. 2.

In FIG. 2 and FIG. 3, there is shown a first embodiment of a wiring part of the invention which is used for wiring various electric parts mounted on a copying machine as one of electrical machinery.

In the embodiment, electric parts 2 (2a to 2c concretely) such as solid state relay (SSR), clutch, cooling fan and others are disposed on an upper side of the equipment frame 1, electric parts 2 (2d to 2f concretely) such as main motor, counter, sensor and others are disposed on a lower side of the equipment frame 1, and a beltlike portion positioned along the center of the equipment frame 1 which is located in the neighborhood of the electric parts 2 is reserved as a space S (indicated by a one-dot chain line in FIG. 2) in which the wiring part H will be disposed.

Figure 4:
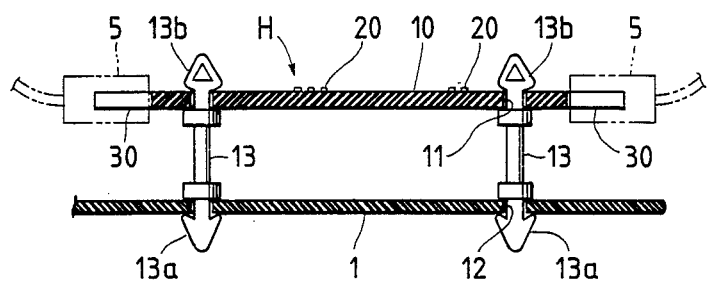
FIG. 4 is a sectional end view, from the left, of the frame 1 and substrate 10 of FIG. 3, after assembly, and representing a mounting structure of the wiring part of the first embodiment.

The wiring part H has a long and rectangular insulating substrate 10 which corresponds to the aforementioned space S, and a hard insulating material such as, for example, paper phenol, paper epoxy, glass epoxy or the like which is used normally as a printed wiring board is employed for the insulating substrate 10. A pair of locking holes 11 are perforated near both ends longitudinally of the insulating substrate 10, and mounting holes 12 are provided on the equipment frame 1 corresponding to each locking hole 11. Further, a clip 13 having a locking portion on both sides is used as a locker for the insulating substrate 10, and as shown in FIG. 4, a locking portion 13a provided at one end of the clip 13 is locked beforehand in the mounting hole 12 of the equipment frame 12, and then another locking portion 13b provided at the other end of the clip 13 is locked in the locking hole 11 of the insulating substrate 10, thereby disposing the insulating substrate 10 apart from the equipment frame 1.

Wiring pattern conductors 20 (20a to 20f concretely) corresponding to each of the electric parts 2a to 2f are formed integrally on front side of the insulating substrate 10, and the wiring pattern conductors 20 are those for forming predetermined wiring patterns, through which current is directed to each electric part 2, according to a normal process for manufacturing printed wiring boards. Further, one end portion of each wiring pattern conductor 20 is disposed concentrically at a position near one end side longitudinally of the insulating substrate 10. Then, an upper portion of each wiring pattern conductor 20 is covered with an insulating layer (not shown) such as solder resist, coating material or the like.

Figure 5:
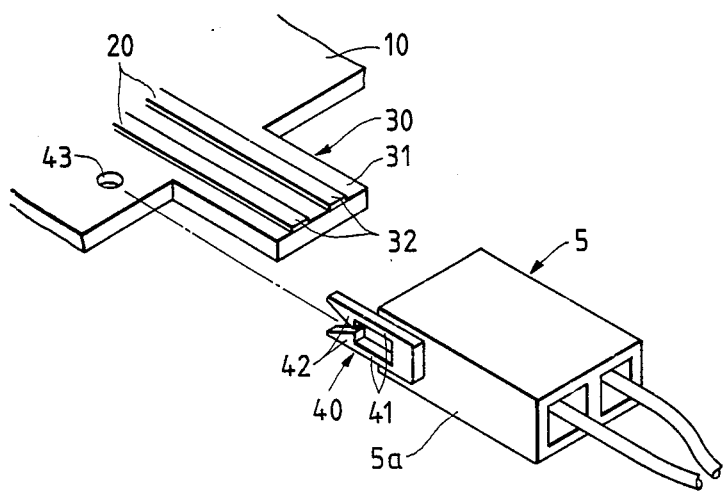
FIG. 5 is an enlarged perspective view of a section IV in FIG. 3.

Further, wiring connectors 30 (30a to 30f concretely) are provided fixedly on both side edges in cross direction of the insulating substrate 10 correspondingly to the portions near each of the electric parts 2a to 2f so as to be connected with a connector 5 provided at the side of each electric part. In the embodiment, as shown particularly in FIG. 5, the wiring connector 30 is constituted as a card edge contact for which a protrusion 31 is formed integrally on both side edges in cross direction of the insulating substrate 10 corresponding to the portions near each of the electric parts 2a to 2f, and another end portion of each of the wiring pattern conductors 20a to 20f is formed extendedly on a portion of the protrusion 31 to thereby constitute a contact part 32. In the embodiment, furthermore, the connectors 5 (5a to 5f concretely) on a side of each electric part 2 comprise a card edge connector and are provided with a retainer 40 for retaining a coupled state with the wiring connectors 30. As shown in FIG. 5 for example, the retainer 40 is disposed on a side portion of a housing 5a of the connector 5, consisting of a pair of elastic protrusions 41 for holding the insulating substrate 10 elastically therebetween, V-shaped locking projections 42 are formed inwardly on the ends of the elastic protrusions 41 so that the locking projection 42 are locked detachably in a locking hole 43 provided at a corresponding portion of the insulating substrate 10 when both connectors 5, 30 are connected.

Figure 6:
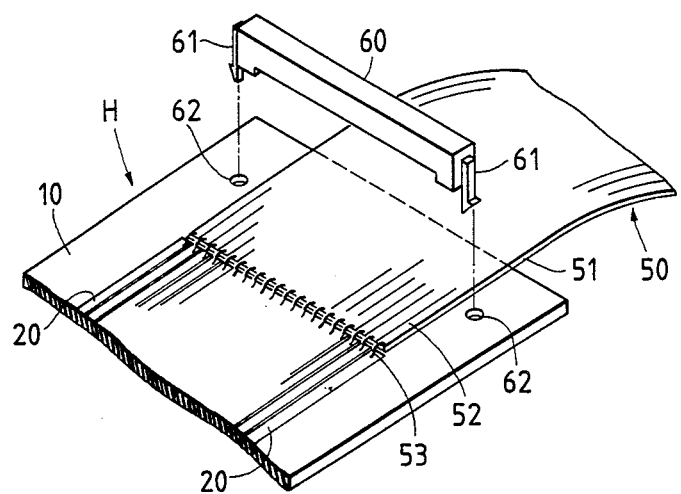
FIG. 6 is an enlarged perspective view of a section V in FIG. 3.

Further, a flat wire 50 with desired wires 52 distributed on a flexible insulating film 51 is connected to one end portion of the wiring pattern conductor 20 through, for example, soldering. Then, in the embodiment shown in FIG. 6, a portion of the flat wire 50 positioned near a connecting portion 53 between the flat wire 50 and the wiring pattern conductor 20 is held down by a retainer plate 60 and clip members 61 are provided integrally on both ends of the retainer plate 60 so as to be inserted and locked in locking holes 62 provided on the insulating substrate 10.

Accordingly, when each electric part 2 on the equipment frame 1 is wired by means of the wiring part relating to the embodiment, the wiring part H is mounted on a predetermined portion of the equipment frame 1 through the clip 13, and then the connectors 5 of each electric part 2 will be connected to each corresponding wiring connector 30.

In such process for wiring, since the wiring part H is designed such that a group of wirings of the electric parts 2 is unified as one part, the wiring part H mounted on a predetermined portion of the equipment frame 1 as above will be place in position and so locked in disambiguation to the equipment frame 1. Consequently, the wiring part H is free from trouble of having wiring harnesses entangled at every electric parts 2 as is often the case with the conventional wiring part, and hence requires no such work for bundling and retaining the wiring harness group by means of a clamp member when distributing a plurality of wiring harnesses.

Further, since the corresponding wiring connectors 30 are provided fixedly on a portion of the wiring part H positioned in the neighborhood of each electric part 2, both the connectors 5, 30 will be connected perfectly and simply by slightly shifting the connector 5 of each electric part 2 with one hand. In this case, the wiring harness between the electric parts 2 and the connectors 5 on the side of electric parts 2 can be minimized in length, and from setting as above, the connectors 5 on the side of electric parts 2 will never swing needlessly, and both the connectors 5, 30 can be connected more simply.

Still further, in the embodiment, since the insulating substrate 10 is constituted of a hard material, the wiring part H will not bend needlessly at the time of mounting, thus it can be placed in position easily to the equipment frame 1, thereby simplifying the work for mounting the wiring part H.

Furthermore, in the embodiment, since a card edge contact is used as the wiring connector 30, the wiring connector 30 can be formed simultaneously with forming the siring pattern conductors 20 on the insulating substrate 10, thus the process for manufacturing the wiring connectors 30 is not particularly required, another part need not be mounted as the wiring connector 30, and thus the number of component parts for the wiring part H can be decreased. Further, the wiring connectors 30a to 30c corresponding to the electric parts 2a to 2c disposed on an upper side of the equipment frame 1 and the wiring connectors 30d to 30f corresponding to the electric parts 2d to 2f disposed on a lower side of the equipment frame 1 are disposed in parallel and in the same direction, therefore the direction in which the connectors 5 of each electric part 2 positioned on upper and lower sides of the equipment frame 1 are inserted can be made commonable each other, and thus the work for connecting both the connectors 5, 30 will be simplified more. Then, each of the connectors 5 on the side of electric parts 2 is provided with the retainer 40, and since the retainer 40 retains a coupled state between the connector 5 and the wiring connector 30, the connectors 5, 30 will never be detached due to vibration or other cause of the electrical equipment. Further, in the embodiment, the retainer 40 on a side of the connector 5 and a locking hole 43 are disposed asymmetrically with respect to the center line in insertion direction of the connector 5, therefore an erroneous insertion of the connector 5 on the side of electric parts 2 to the wiring connector 30 can be prevented.

Still further, in the embodiment, a portion of the flat wire 50 away from the connecting portion 53 between an end portion of the wiring pattern conductor 20 on the insulating substrate 10 and the flat wire 50 is held down by the retainer plate 60. Therefore, in the unlikely event that some external force works on a portion of the flat wire 50, and the flat wire 50 is pulled or pushed, a shift of the flat wire 50 is constrained by the retainer plate 60, and damage of the connecting portion 53 between the wiring pattern conductor 20 and the flat wire 50 can be effectively prevented.

Figure 7:
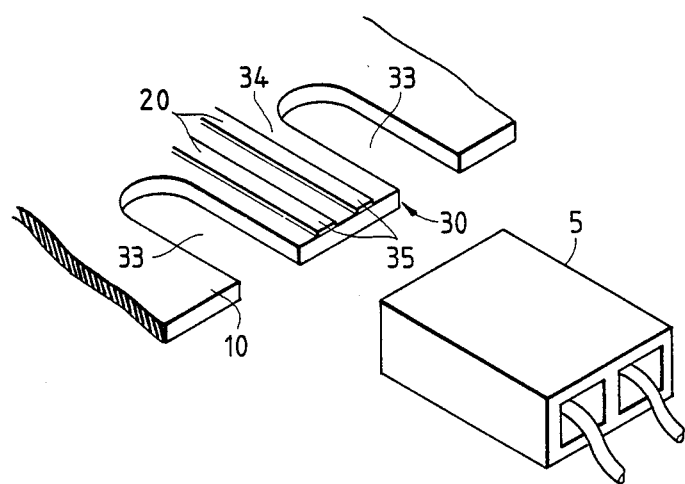
Figure 8A:
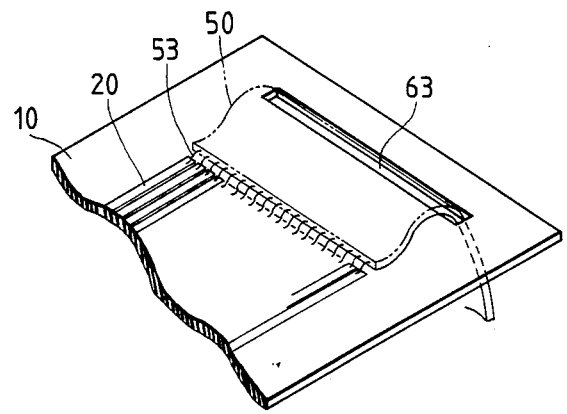
FIG. 8 (A) and (B) are other modifications of the wiring connector as shown in FIG. 5, representing a variant of a connection structure of the wiring part used in the first embodiment and a flat wire.
Figure 8B:
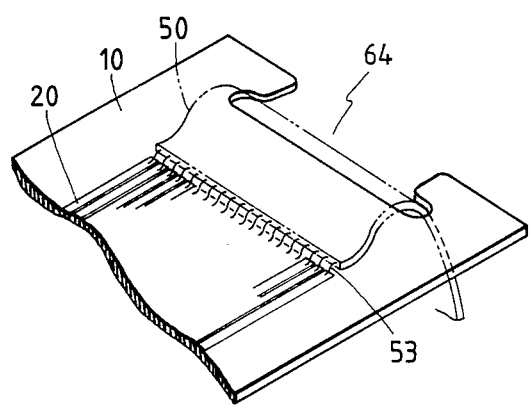

Then, in the above-described embodiment, a card edge obtainable from forming the protrusion 31 on one part of the insulating substrate 10 and further forming the contact part 32 on a portion of the protrusion 31 is used for the wiring connector 30, however, the invention is not necessarily limited thereto, and, as shown in FIG. 7 for example, a card edge constructed such that a pair of cut portions 33 are formed on one part of the insulating substrate 10 to leave an insertion 34 between the cut portions 33, and contact parts 35 are formed on a portion of the insertion 34 is also acceptable. Then, a holding structure of the flat wire 50 connected to the wiring pattern conductor 20 is also not limited to what is represented by the embodiment, and as shown in FIG. 8 (A) for example, a slit 63 is provided on an end portion of the insulating substrate 10, the flat wire 50 will be inserted in a portion of the slit 63 and then locked at the portion of the slit 63. In this case, as shown in FIG. 8 (B), if a cut portion 64 communicating with the slit 63 is provided on an end portion of the insulating substrate 10, then the flat wire 50 can be detached within the slit 63 through the cut portion 64, thereby simplifying the work for distributing the flat wire 50.

Figure 9:
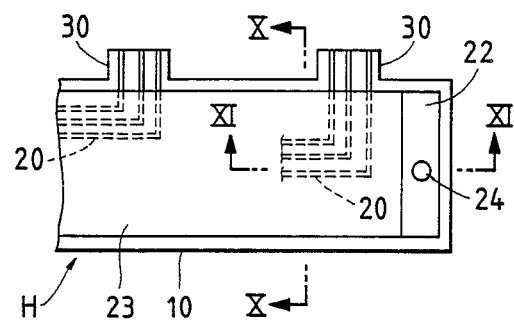
FIG. 9 is a main part plan view representing a second embodiment of the wiring part according to the invention.
Figure 10:
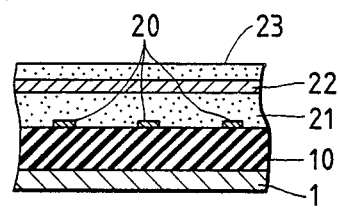
FIG. 10 and FIG. 11 are sectional views taken on lines IX—IX and X—X in FIG. 9 respectively.
Figure 11:
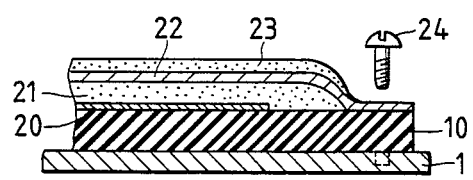

FIGS. 9 to 11 show a second embodiment of this invention. In FIGS. 9 to 11, basic construction of the wiring part H is similar to the first embodiment such that the desired wiring pattern conductors 20 are formed on the insulating substrate 10, and are covered with an insulating layer 21, and the wiring connectors 30 consisting, for example, of a card edge are provided on one side edge of the insulating substrate 10, however, there are the following different points from the first embodiment. A conductive layer 22 consisting of conductive ink or the like which is known as conductive paint or organic conductive paste is coated on the insulating layer 21 of the insulating substrate 10, and is covered with an insulated surface layer 23. Further a portion of the insulated surface layer 23 corresponding to an end portion or a mounting area of the insulating substrate 10 is cut off and the insulating substrate 10 is mounted on the equipment frame (chassis) 1 or a metal zone so as to maintain contact with the conductive layer 22 by means of a conductive retainer 24 such as screw or the like.

Consequently, according to the wiring part relating to the second embodiment, action and effect similar to the first embodiment can be obtained, and besides, even if an electromagnetic noise arises from a current carrying path consisting of the wiring pattern conductor 20, the electromagnetic noise escapes to a side of the equipment frame 1 from the conductive layer 22 through the retainer 24, therefore the possibility that the electromagnetic noise is radiated around to exert an evil influence on operation of the external equipment may be avoided.

Further, in case a wiring harness is used as the wiring part so as to prevent such electromagnetic noise from being radiated around, the wiring harness must be covered with a shielding material, a shield wire will be used, or a noise filter must be provided on terminals, therefore a fabrication of the wiring harness becomes troublesome, and the number of parts is increased inevitably therefor, however, in the embodiment, a shielding means can simply be applied through a simple process that a conductive paint is applied on the insulating substrate 10, or a conductive ink is applied to printing, therefore a manufacturing process of the wiring part can be simplified and further the increase in the number of parts can be avoided as compared with the case where wiring harness is used as the wiring part.

Figure 12:
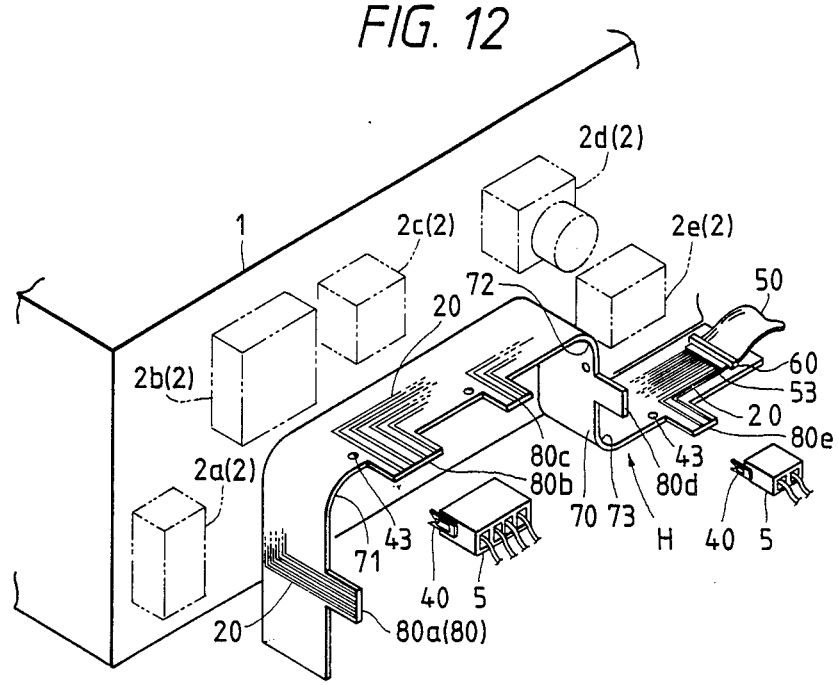
FIG. 12 is a perspective view representing a third embodiment of the wiring part according to the invention.
Figure 13:
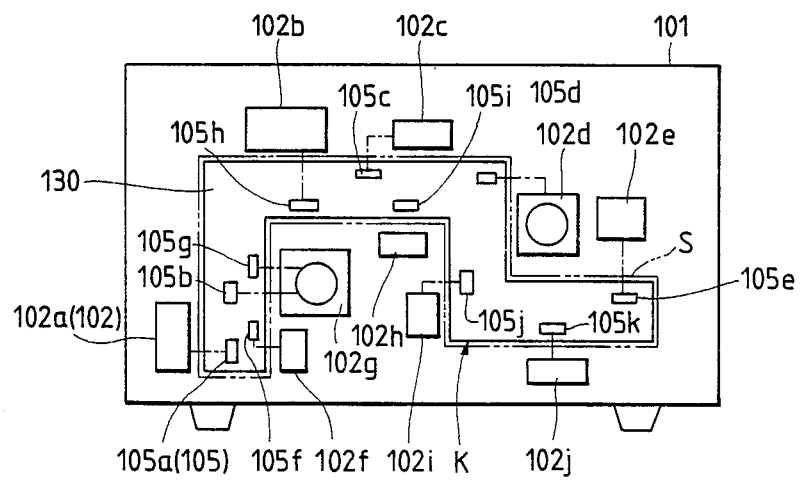
FIG. 13 is a schematic diagram showing a fourth embodiment of a wiring module according to this invention.

FIG. 12 shows a third embodiment of this invention. In FIG. 12, there is shown the wiring part H effective where a plurality of electric parts 2 (2a to 2e concretely) are disposed dispersedly on the equipment frame 1, and a sufficient space for disposition is hard to secure on the equipment frame 1.

In the third embodiment, differently from the first and second embodiments, an insulating substrate 70 constituting the wiring part H is formed of a hard flexible plate (for example, BENDFLEX by Rogers Company in U.S.A. or the like) which is bendable and capable of retaining a bent shape, disposed vertically to a plane of the equipment frame 1, and is bent at three portions 71 to 73, for example, so as not to interfere with the positions where the electric parts 2 are disposed. Then, the insulating substrate 70 is fixed to a proper fitting bracket (not shown) provided, for example, on a side of the equipment frame 1 using a proper fitting member.

Further, as in the case of the first and second embodiments, the wiring pattern conductors 20 corresponding to each electric part 2 are formed on one side surface of the insulating substrate 70, however, differently from the first and second embodiments, wiring connectors 80 (80a to 80e concretely) consisting of a card edge contact each are formed on a protrusive end edge side of the insulating substrate 70 positioned in the neighborhood of each electric part 2.

Then, other construction is almost similar to the first and second embodiments, therefore a further and detailed description will be omitted here.

Accordingly, in case a wiring work for each electric part 2 on the equipment frame 1 is carried out by means of the wiring part H relating to the embodiment, the wiring part H is mounted on a predetermined portion of the equipment frame 1, and then the connector 5 of each electric part 2 will be connected to the corresponding wiring connector 80, thus obtaining action and effect similar to the first and second embodiments basically.

In addition further, in the embodiment, since the insulating substrate 70 can be bent at a proper portion, a shape of the insulating substrate 70 may be modified arbitrarily according to an layout of each electric part 2 on the equipment frame 1, and thus a degree of freedom may be allowed to the layout of each electric part 2 on the equipment frame 1. Then, the insulating substrate 70 is disposed vertically to the equipment frame 1, therefore the space for disposing the wiring part on the equipment frame 1 can also be narrowed.

Further, in the embodiment, since the wiring connectors 80 are provided in parallel all in the same direction, the directions in which the connectors 5 on the side of electric parts 2 come to coincide all, and thus a working efficiency for connection of the connectors 5 is further enhanced. Still further, in the embodiment, insertion directions of the connectors 5 coincide with mounting direction of each electric part 2, therefore if the connectors 5 are provided to have clearance whereby each electric part 2 is capable of absorbing some dislocation at positions corresponding to the wiring connectors 80, then the connectors 5, 80 can be connected together simultaneously with the work for mounting each electric part 2 on the equipment frame 1.

The insulating substrate 70 may be enclosed in a case (not shown) having an opening through which a connector part is connectable, and the case may be mounted on the equipment frame 1 with snap fit, screw, wedge, adhesive tape or the like. Such examples will be described in detail hereinunder.

FIGS. 13 to 16 show a fourth embodiment of this invention. In FIG. 13 to 16, there is shown a wiring module of the invention which is used for wiring various electric parts mounted on a copying machine as one of electrical machinery.

In the fourth embodiment, various electric parts 102 (102a to 102j concretely) such as solid state relay (SSR), clutch, cooling fan, main motor, counter, sensor and others are disposed properly in dispersion on the equipment frame 1 similarly to the third embodiment, and a bent beltlike portion along positions in the neighborhood of the various electric parts 102 is reserved as a space S (indicated by a virtual line in FIG. 13) for disposing a wiring module K relating to this embodiment. Then, the wiring module K comprises a wiring part 110 for forming a current carrying path to each electric part 102, a module case 130 for enclosing and holding the wiring part 110 therein, and a connector 150 at the side of the wiring part, which is connected to the connector 5 on a side of each electric part 2.

In the embodiment, the wiring part 110 is divided into two systems, as shown in FIG. 15 for example, a bundle of wiring harness 111 for forming a plurality of current carrying paths from an AC circuit part in a control substrate (not shown) or the like, and one wired substrate 115 for forming a plurality of current carrying paths from a DC circuit part in the control substrate (not shown) or the like.

An intermediate connector 112 for branching the current carrying path and a thermostat 113 operating as a temperature sensor are connected to the wiring harness 111 at proper portions, and one end portion of the wiring harness 111 is connected to the control substrate or the like at a predetermined portion through a connecting wire (not shown).

Figure 17:
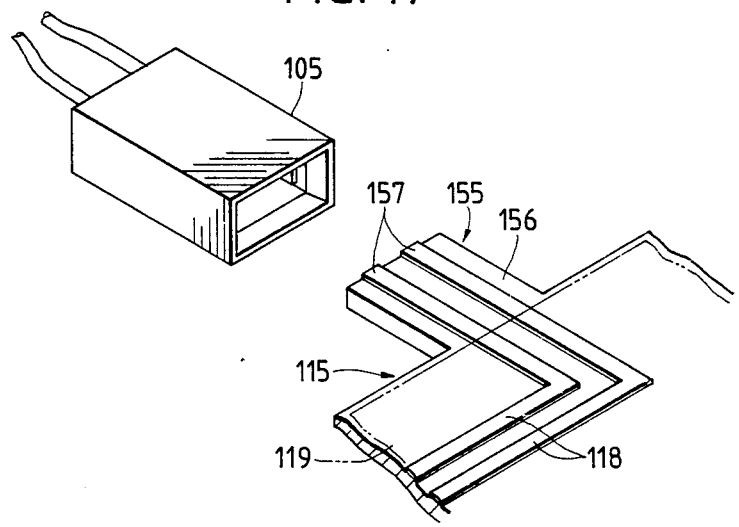
FIG. 17 is an enlarged perspective view of a portion near a connector of a wired substrate employed in the fourth embodiment.
Figure 18:
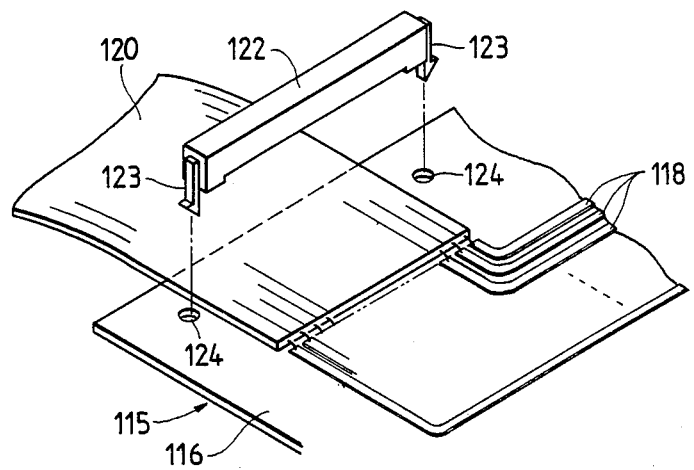
FIG. 18 is a perspective view for showing a construction of portion where the wired substrate of the fourth embodiment and another wiring material are connected together.

On the other hand, the wired substrate 115 has an insulating substrate 116, and the insulating substrate 116 is constituted of a hard flexible plate (BENDFLEX by Rogers Company in U.S.A. or the like) bendable and capable of retaining a bent state, disposed vertically to the equipment frame 101, and is bent and so formed at three portions 117a to 117c correspondingly to the space S of the wiring module K on the equipment frame 101. Then, wiring pattern conductors 118 corresponding to the electric parts 102 connected to the DC circuit part are formed integrally with the insulating substrate 116, and the wiring pattern conductors 118 are those of preparing predetermined wiring patterns, functioning as current carrying paths to the electric parts 102 according to a normal manufacturing process of printed wiring boards, and each wiring pattern conductor 118 is covered with an insulating layer 119 as indicated by a virtual line in FIG. 17. Further, one end portion of each wiring pattern conductor 118 is disposed concentrically at a position near one end side longitudinally of the insulating substrate 116, a flexible flat wire 120 is connected through soldering, for example, to the one end portion of the wiring pattern conductor 118, and the flat wire 120 is connected to the control substrate or the like at a predetermined portion. In the fourth embodiment similarly to the above-described embodiments, a portion of the flat wire 120 positioned near a connecting portion 121 between the wiring pattern conductor 118 and the flat wire 120 is held down, as shown in FIG. 18 for example, by a retainer 122, and the retainer 122 is provided with clip parts 123 formed integrally on both ends thereof, inserted and locked in a locking hole 124 provided on the insulating substrate 116.

Figure 16:
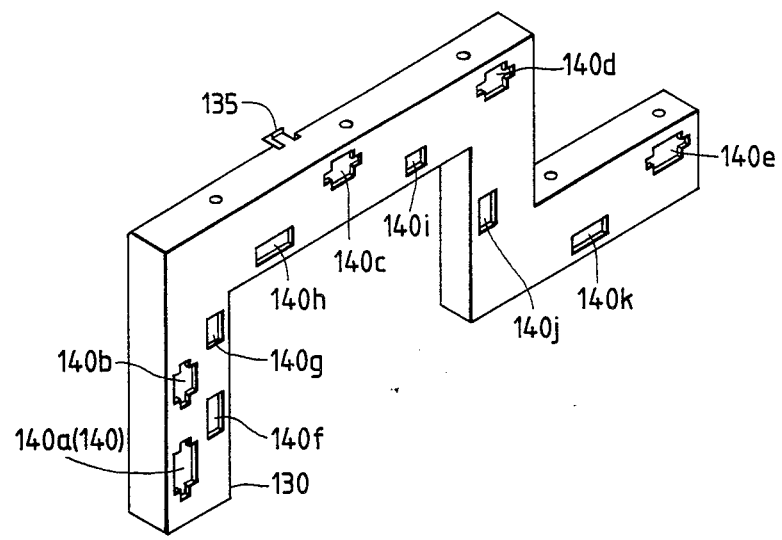
FIG. 16 is a perspective view of a module case in FIG. 15 which is taken in the direction IV thereof.

The module case 130 is integrally formed of a heat-resisting synthetic resin such as ABS, PS or the like, as shown particularly in FIG. 15 and FIG. 16, according to the space S of the wiring module K on the equipment frame 101, and is provided with a space for enclosing the wiring parts 110 internally and also an insertion opening 131 for the wiring parts 110 entirely on its one side. In the embodiment, the module case 130 is partitioned into two chambers, that is, upper and lower subdivided chambers 133a and 133b, longitudinally by an insulating partition plate 132. The upper subdivided chamber 133a is intended for space to enclose the wiring harness 111 therein, while the lower subdivided chamber 133b is intended for space to enclose the wired substrate 115, and further a plurality of air holes 134 are provided on one side of the module case 130 which is an upper outside wall of the upper subdivided chamber 133a. Further in the embodiment, the module case 130 uses a material in which a magnetic shielding material (such as, for example, carbon fiber, stainless steel fiber or the like) is mixed, or has a conductive paint applied to the surface or a conductive sheet sticked thereon, thereby ensuring a magnetic shielding effect not to allow electromagnetic waves generated from the wiring parts 110 to flow outwardly. Still further, locking clips 135 (135a to 135d concretely) lockable in locking holes 101a of the equipment frame 101 are formed protrusively from the surface of the insertion opening 131 at several spots of an edge portion of the insertion opening 131 of the module case 130.

Retainer plates 137 are fixed on the upper subdivided chamber 133a through support plates 136 at proper internals so as to keep the enclosed wiring harness 111 from coming outward. Then, pairs of holding walls 138 (138a to 138h concretely) for holding the wired substrate 115 are integrally formed at proper intervals so as to project inwardly from the lower outside wall of the module case 130 and the insulating partition plate 132 respectively within the lower subdivided chamber 133b, and a clearance 139 slightly larger than the thickness of the wired substrate 115 is provided between each pair of holding walls 138.

Furthermore, openings 140 (140a to 140k concretely) for connecting connectors are provided at positions of the portion opposite to the surface of the insertion opening 131 of the module case 130, which are near each electric part 102 on the equipment frame 101. Draw-out holes (not shown) for drawing therethrough the connecting wire connected to the wiring harness 111 and the flat wire 120 connected to the wired substrate 15 are provided on the module case 130.

Further, connectors 151 (151a to 151e concretely) as the wiring part connectors 150 which is connectable to the corresponding electric part connectors 105 (105a to 105e concretely) are connected to each end portion of the wiring harness 111 as the wiring parts 110. As shown particularly in FIG. 15 and FIG. 19 (A), the connector 151 has a proper number of contacts 153 within a rectangular parallelepipedic connector housing 152, and positioning members 154 are provided on both wall surfaces of the connector housing 152. Each positioning member 154 has a pair of elastically deformable locking protrusions 154a provided on both wall surfaces of the connector housing 152 in open-sided form with the base ends fixed thereon, a tapered locking step 154b is formed on a free end side of each locking protrusion 154a, and a stopper step 154c is formed on the wall surface of the connector housing 152 positioned on both sides of the locking protrusion 154a apart by the thickness of the module case 130 from a locking portion of the locking step 154b. The openings 140 (140a to 140e concretely) corresponding to the connectors 151 are formed rectangularly according to the connector housing 152 and a positioning cut 141 is formed at a portion corresponding to the locking protrusion 154a of the opening 140, so that the locking step 154b of the locking protrusion 154a engages with the positioning cut 141 and the stopper steps 154c hold an edge of the opening 140 therebetween across the locking step 154b, thus placing the connectors 151 in a predetermined position.

A construction of the aforementioned positioning member 154 is not necessarily limited to that of the embodiment. As shown in FIG. 19 (B) for example, each component of the positioning member 154 may be provided on other both wall surfaces of the connector housing 152, or as shown in FIG. 19 (C), the stopper step 154c may be formed integrally with the locking protrusion 154a, further as shown in FIG. 19 (D), the locking protrusion 154a and the stopper step 154c may be provided separately on different wall surfaces of the connector housing 152, or further, construction, number and others of the locking protrusion 154a and the stopper step 154c may be modified properly in design.

Card edge contacts 155 (155a to 155f) as the wiring part connectors 150 which are connectable to card edge connectors as the corresponding electric part connectors 150 (105f to 105k) are formed on one side edge of the wired substrate 115 as the wiring part 110. The card edge contact 155 is designed such that a protrusion 156 extending along the surface of the wired substrate 115 is formed integrally on one side edge of the wired substrate 115 which faces the openings 140 (140f to 140k), a corresponding part of the wiring pattern conductor 118 on the wired substrate 115 is formed extendedly on a portion of the protrusion 156, and then nickel is plated thereon to form a contact part 157.

Referring next to the case where the wiring module K relating to the embodiment is assembled, first the connectors 151 as the wiring part connectors 150 are positioned and fixed in the corresponding openings 140 (or 140a to 140e) for connecting connectors, and while the wiring harness 111 is enclosed and so retained in the upper subdivided chamber 133a of the module case 130 thereafter, the wired substrate 115 may be retained and fixed in the lower subdivided chamber 133b so that the card edges 155 as the wiring part connectors 150 and the flat wires 120 will pass through the corresponding openings 140 (140f to 140k) and the draw-out holes (not shown).

Figure 20:
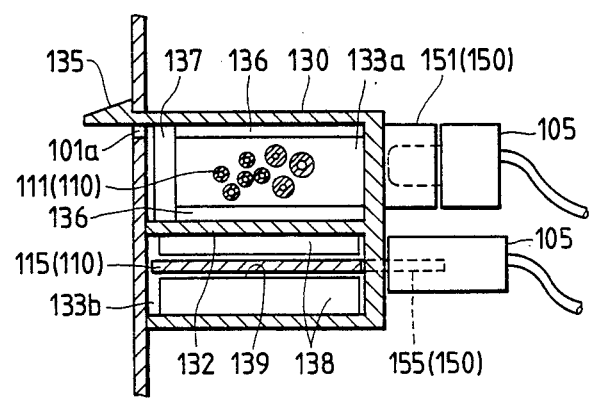
FIG. 20 is a sectional view of the connector portion of wiring module K of FIG. 14 after assembly.
Figure 19B:
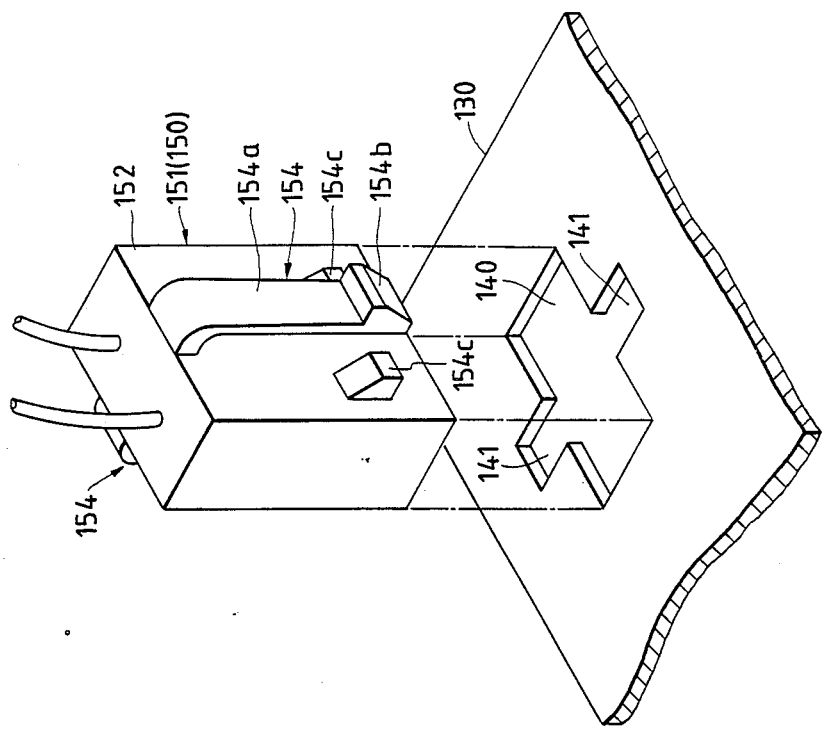
FIG. 19 (A) is a perspective view for showing a construction for mounting a wiring harness connector according to the fourth embodiment to a module case.
Figure 19A:
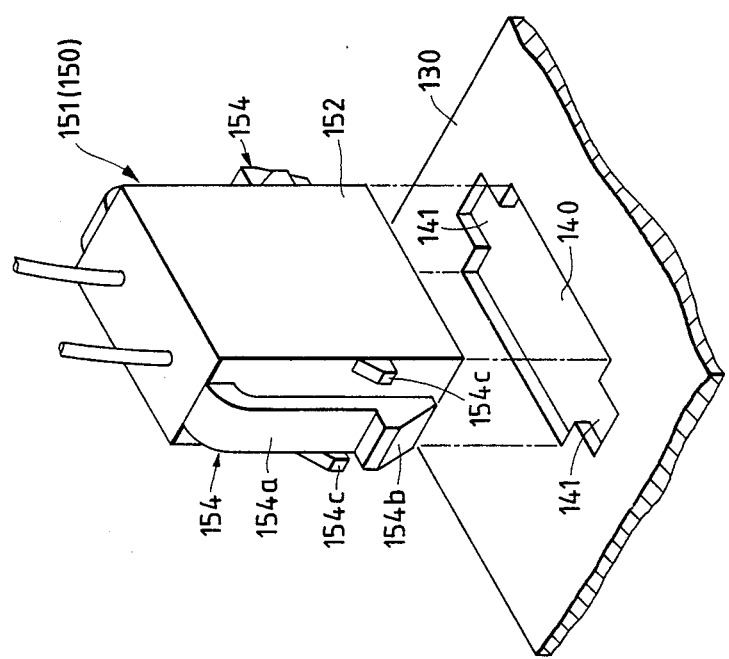
Figure 19C:
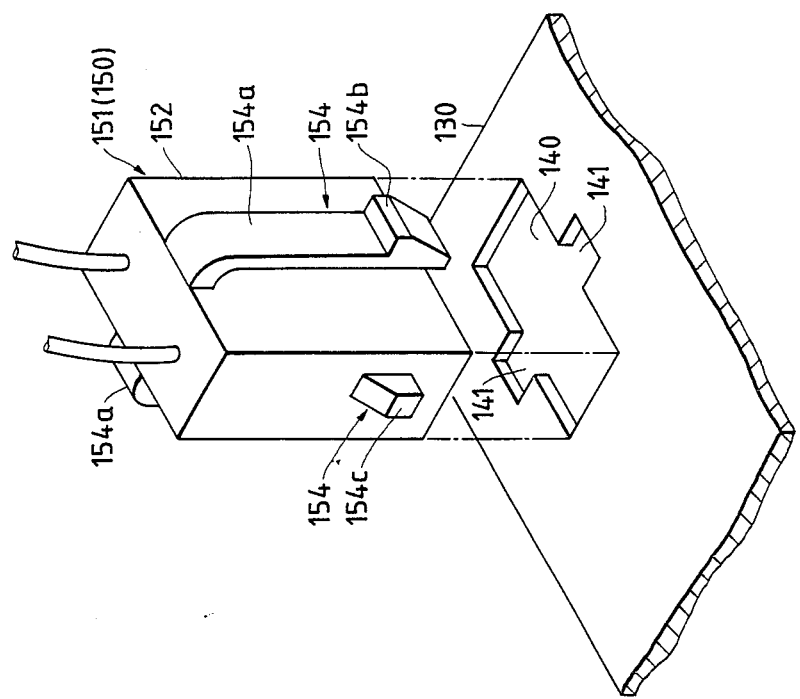
Figure 19D:
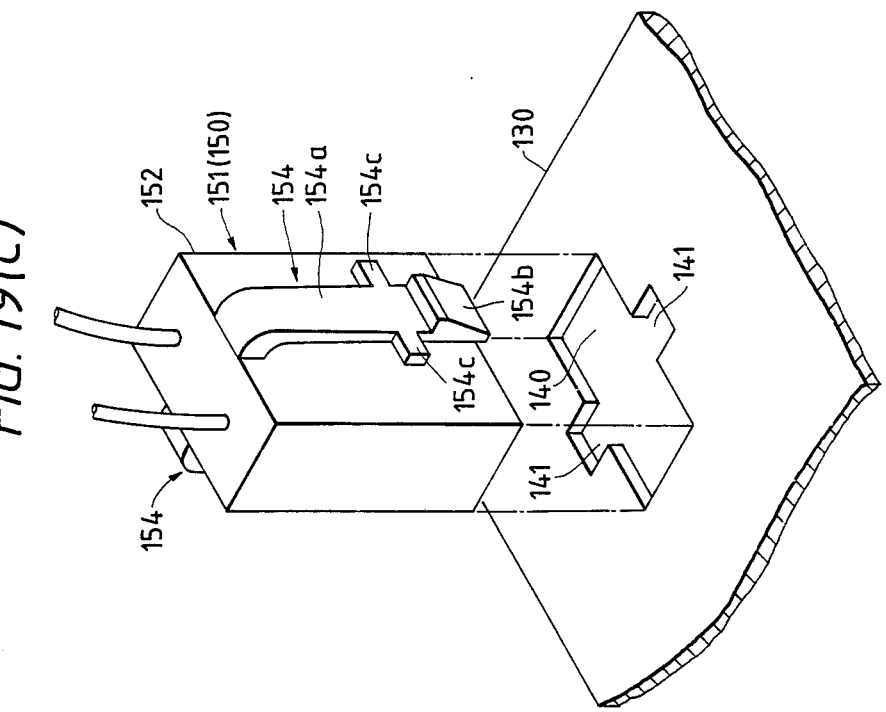

In such state, as shown in FIG. 20, the wiring harness 111 is retained within the subdivided chamber 133a by the retainer plate 137, each connector 151 for the wiring harness 111 is positioned and fixed in the opening 140, therefore the wiring harness 111 will never shift needlessly in the subdivided chamber 133a or come out of the subdivided chamber 133a.

For wiring each electric part 102 on the equipment frame 101 by means of the wiring module K assembled as above, as shown in FIG. 15 and FIG. 20, the above-described wiring module K is mounted at a predetermined portion of the equipment frame 101 through the locking clips 135 of the module case 130, the wiring harness 111 as a wiring part and the wiring substrate 115 are connected thereafter to control substrate and others (not shown), and then the connectors 105 for each electric part 102 are connected to the corresponding wiring part connectors 150.

Figure 1:
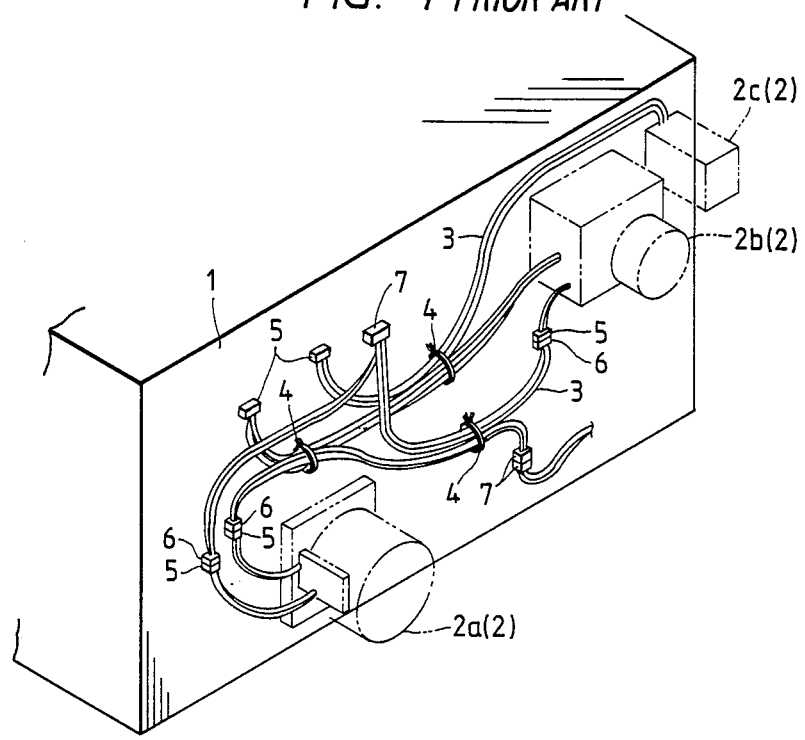
FIG. 1 is perspective view representing one example of a prior art wiring part.

In such wiring process, since the wiring module K is designed such that the wiring parts 110 for each electric part 102 are modularized into one, the wiring parts 110 in the wiring module K will be placed in a predetermined position in disambiguation to the equipment frame 101 by mounting the wiring module K at a predetermined portion of the equipment frame 101. Consequently, the wiring harness (denoted by numeral 3 in FIG. 1) which is a wiring part will not be laid now individually at every electric parts 102, the wiring harnesses will not be entangled each other at the time of wiring work, and a work for bundling and retaining a wiring harness group by means of a clamp member will not particularly be required for distributing a plurality of wiring harnesses.

The wiring part connectors 150 corresponding to each electric part 102 are provided fixedly on a portion of the wiring module K positioned in the neighborhood of each electric part 102, therefore both the connectors 5, 150 can be connected perfectly and simply by shifting the connector 105 for each electric part 102 mounted on the equipment frame 101 slightly with one hand. In this case, a length of the wiring harness between the electric part connector 105 and the electric part 102 can be minimized, therefore the electric part connector 105 will not be dangled needlessly, and the work for connecting the connectors 105, 150 can be made simpler.

Furthermore, in the embodiment, the wired substrate 115 with a plurality of current carrying paths arranged in one is used as the wiring part 110, therefore not only the number of wiring parts can be decreased as compared with the case where a wiring part like the wiring harness is used at every electric parts 102, but also the work for incorporating the wiring parts 110 in the module case 130 can be simplified.

Besides, in the embodiment, a magnetic shielding is applied to the module case 130, therefore if an electromagnetic wave is generated from the wiring parts 110 in the module case 130, the electromagnetic wave will flow to a ground side through wall of the module case 130, and thus the electromagnetic wave can be prevented effectively from flowing externally of the module case 130. It is therefore not necessary to wind a shield tape on the wiring part 110 or use a shielding wire thereon, and hence each electric part 102 will be kept simply from EMI (Electromagnetic Interference) trouble.

Further, proper air holes 134 are provided on an upper wall of the module case 130 partitioning the upper subdivided chamber 133a, therefore even if temperature in the subdivided chamber 133a rises on the heat from the wiring harness 111, the hot air will be discharged externally through the air holes 134, and thus a temperature rise in the subdivided chamber 133a is suppressed effectively. Consequently, a drop in permissible current capacity of the wiring harness 111 due to a rise of atmospheric temperature can be prevented.

Still further, the module case 130 has the two subdivided chambers 133a, 133b provided by the insulating partition plate 132, therefore in the unlikely event that a covering tube of the wiring harness 111 is damaged, an impression of excessive current or voltage on a side of the wired substrate 115 will be prevented effectively.

In the embodiment, card edge connectors are used partly for the electric part connectors 105, therefore the card edge contact 155 can be formed simultaneously with forming the wiring pattern conductor 118 on the insulating substrate 116, a manufacturing process peculiar to the wiring part connector 150 is not required for the wired substrate 115, and further another part is not necessary to mount as the wiring part connector 150, thus decreasing the number of components for the wiring part connector 150.

Further, in the embodiment, the wiring part connectors 150 corresponding to each electric part 102 disposed on the equipment frame 101 are provided each other in parallel in the same direction, therefore the directions in which the connectors 105 for each electric part 102 can be made common, thus simplifying a connecting work of the connectors 105, 150.

Figure 21:
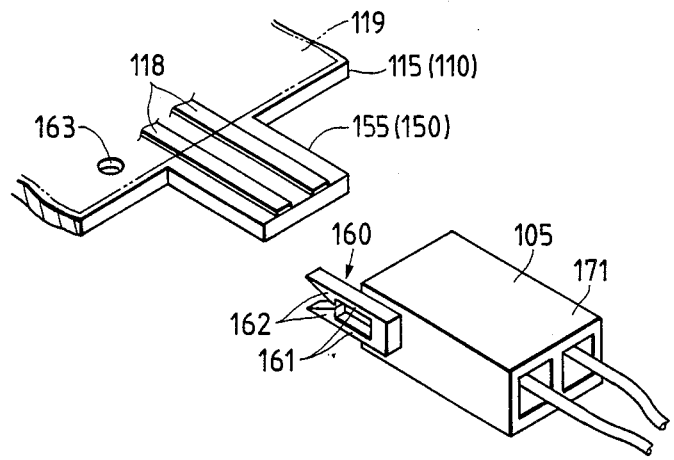
FIG. 21 and FIG. 22 are perspective views for showing a variant of the construction for connecting an electric part connector to a wiring part connector according to the fourth embodiment.

Still further, similarly to the first, second and third embodiments, by providing a retainer 160 for keeping both coupled in good condition on either the electric part connector 105 or the wiring part connector 150, a trouble that the connectors 105, 150 would be detached needlessly due to vibration or other cause of the electric equipment may be avoided effectively. The retainer 160 shown in FIG. 21 is applied between the electric part side connector 105 constructed as a card edge type connector and the card edge 155 working as the wiring part connector 150, a pair of elastic protrusions 161 whereby the wired substrate 115 is held elastically are disposed, for example, on a side portion of a housing 171 of the electric part side connector 105, a V-shaped locking member 162 is formed inside the tip of the elastic protrusions 161, a locking hole 163 is provided at a corresponding portion of the wired substrate 115, and the locking member 162 is locked detachably in the locking hole 163. In this type, since the elastic protrusions 161 and the locking hole 163 are disposed asymmetrically with respect to the center line in the directions in which the connectors 105, 150 are inserted, an erroneous insertion of the electric part connector 105 in the wiring part connector 150 can also be prevented.

Figure 22:
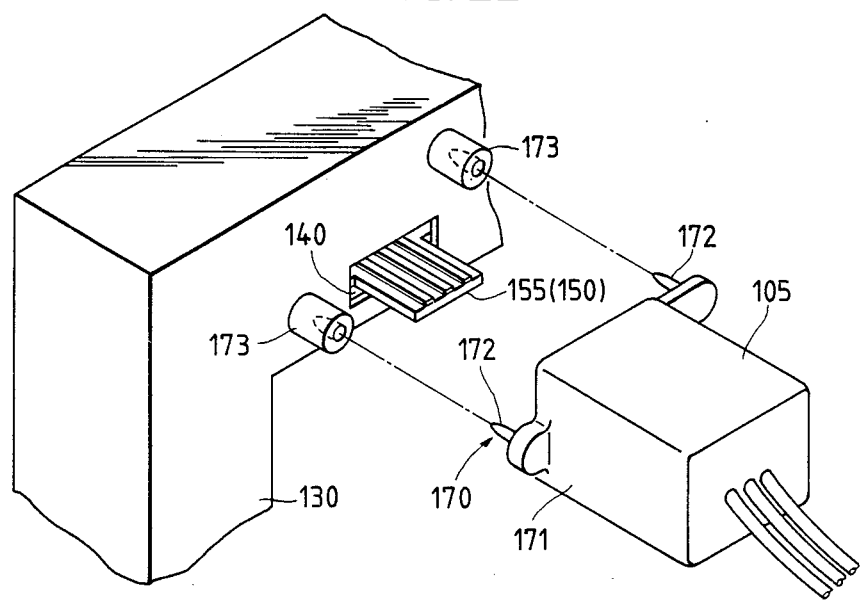
Figure 23:
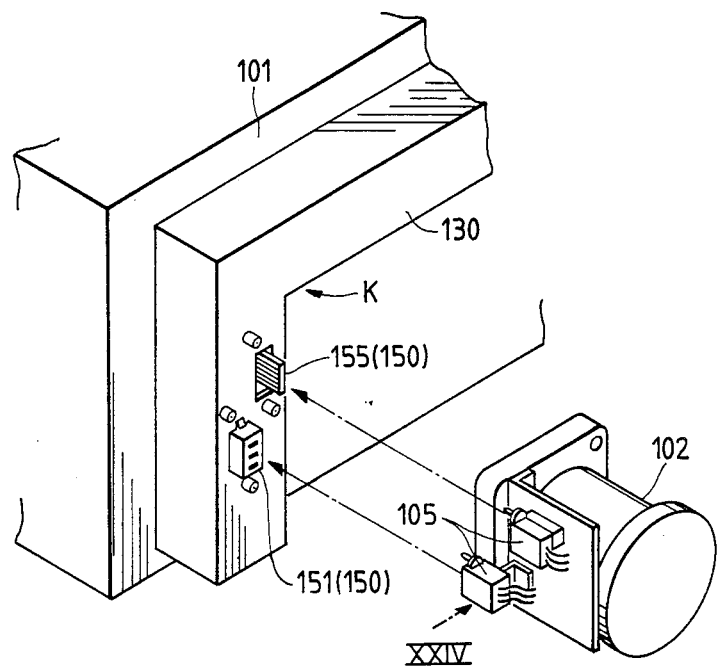
FIG. 23 is a perspective view for showing a constructional example for mounting the electric part connector in FIG. 22.
Figure 24:
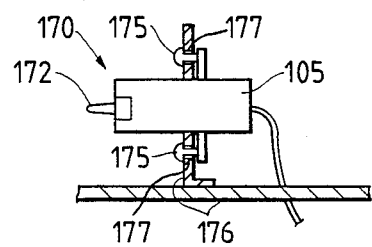
FIG. 24 is a detailed sectional view showing a concrete example of a portion XII in FIG. 23.

In the embodiment, the direction in which the electric part connector 105 is inserted in coincidence with the direction in which each electric part 102 is mounted, therefore the connectors 105, 150 can be connected at a predetermined position by providing, as shown in FIG. 22 for example, guide projections 172 on the housing 171 of the electric part connector 105 and forming guide receivers 173 on an outside of the module case 130 corresponding to the guide projections 172. That is, such a guide mechanism 170 as described above can make the position where the electric part connector 105 and the wiring part connector 150 are connected disambiguous. Further as shown in FIG. 23 and FIG. 24, there is provided an idle motion capable of absorbing some dislocation of the electric part connector 105 to each electric part 102 at positions corresponding to the wiring part connectors 150 (151, 155), wherein, for example, locking clips 175 are provided on the electric part connector 105, mounting holes 177 somewhat larger than diameters of the locking clips 175 are provided on a support bracket 176 mounted to each electric part 102, the locking clips 175 are inserted and locked in the mounting holes 177, so that the connectors 105, 150 can be connected simultaneously with the work in which each electric part 102 is mounted on the equipment frame 101.

As described above, according to the wiring module according to the invention, wiring parts for a plurality of electric parts mounted on an equipment frame are modularized into one, therefore it is not necessary to carry out a wiring work individually at every electric parts, further even if wiring harnesses are used as the wiring part at every electric parts, the wiring harnesses will not be entangled each other, and a clamp member need not be used at the time of distributing work, thus sharply enhancing a working efficiency for wiring each electric part.

Further, according to the invention, a wiring part connector is provided fixedly on a portion of the wiring module positioned in the neighborhood of each electric part, so that each electric part is ready for connecting to the wiring part simply by shifting each electric part side connector only slightly, and thus the electric part can be connected to the wiring part easily with one hand, thereby enhancing sharply the working efficiency for connecting each electric part and wiring part as compared with the prior art.

Still further, according to the invention, since the wiring part is constructed as a printed wiring board, the manufacturing process can be mechanized and automated simply, thus enhancing a mass productivity of the wiring part, and since a pattern of the wiring pattern conductors will properly be selected for disposition and midway branch of the siring path, the wiring part is ready for coping with an engineering change of the wiring path, and extra parts and connectors need not be used for midway branch of the wiring path, thus curtailing extra parts in designing the wiring path, and hence requirements for manufacturing the wiring part cheaply and easily can be satisfied.

What is claimed is:

1. A wiring module for electrically connecting a plurality of electric parts disposed on an equipment frame to a source of electric power, comprising:
   (a) an elongated insulating substrate for attachment to said equipment frame and formed to extend along a path adjacent to electric parts disposed on said frame;
   (b) a pattern of wiring conductors extending along and integral with said insulating substrate for conducting electric current from the source of electric power to each of the electric parts to be connected;
   (c) said insulating substrate having one or more edge portions provided with protrusions integrally formed with said insulating substrate and extending laterally therefrom, said protrusions each being positioned on said insulating substrate at a location adjacent an electric part to be connected and at least a portion of said wiring conductors being integral therewith so as to provide a contact on a corresponding protrusion for connection to a corresponding one of said electric parts.

2. A wiring module as claimed in claim 1, wherein said insulating substrate comprises a hard flexible plate that is bendable and capable of retaining a bent shape.

3. A wiring module as claimed in claim 1, wherein said insulating substrate is disposed substantially vertically to said equipment frame.

4. A wiring module as claimed in claim 1, wherein said wiring conductors and exposed portion of said insulating substrate are coated with a first insulating layer, a conductive layer and a second insulating layer, said conductive layer being electrically connectable to said equipment frame.

5. A wiring module as claimed in claim 4, wherein said conductive layer is formed of conductive ink.

6. A wiring module as claimed in claim 1, wherein electric part connector means is provided on each of said electric parts, said electric part connector means being connected with said protrusions to electrically connect said electric parts with said conductors.

7. A wiring module as claimed in claim 6, wherein at least one of said protrusions and said electric part connector means is provided with a retainer in order to fixedly retain the connection therebetween.

8. A wiring module as claimed in claim 7, wherein said retainer is disposed asymmetrically with respect to the center line in the insertion direction of said protrusions and said electrical part connector means.

9. A wiring module as claimed in claim 1, wherein said protrusions have card edge type connectors comprising end portions of said conductors.

10. A wiring module as claimed in claim 1, wherein said protrusions are designed in parallel so that the inserting directions of all or most of said electric part connector means coincide with each other.

11. A wiring module as claimed in claim 1, said wiring module further comprising a module case formed continuously so as to enclose and hold said substrate and conductors, and detachably mounted to a corresponding mount portion of said equipment frame.

12. A wiring module as claimed 11, wherein said module case comprises an electromagnetic shielding material.

13. A wiring module as claimed, in claim 11, wherein said module case is provided with air holes.

14. A wiring module as claimed in claim 11, wherein when said wiring module is divided into an AC primary side wiring or high voltage wiring system and a DC wiring system, said module case has an insulation partitioning member for partitioning said wiring systems.

15. A wiring module as claimed in claim 11, wherein said protrusions have card edge type connectors comprising end portions of conductors.

16. A wiring module as claimed in claim 11, wherein each of said electric parts is provided with electric part connector means to be connected with said protrusions.

17. A wiring module as claimed in claim 16, wherein at least one of said protrusions and said electric part connector means is provided with a guide member for guiding to a position where both are connected.

18. A wiring module as claimed in claim 16, wherein at least one of said protrusions and said electric part connector means is provided with a retainer for fixedly retain the connection therebetween.

* * * * *

UNITED STATES PATENT AND TRADEMARK OFFICE
CERTIFICATE OF CORRECTION

PATENT NO. : 4,974,121

DATED : November 27, 1990

INVENTOR(S) : Kazuhisa Masuko and Yosuki Ishiguro

It is certified that error appears in the above-identified patent and that said Letters Patent is hereby corrected as shown below:

Column 10, line 13, change "150" to --105--.

Column 13, line 7, change "siring" to --wiring--.

Claim 12, column 14, line 26, after "claimed" insert --in claim--.

Claim 13, column 14, line 29, after "claimed" delete [,].

Signed and Sealed this

Tenth Day of November, 1992

Attest:

DOUGLAS B. COMER

*Attesting Officer*       *Acting Commissioner of Patents and Trademarks*